United States Patent [19]

Deaton et al.

[11] Patent Number: 5,322,567
[45] Date of Patent: Jun. 21, 1994

[54] PARTICULATE REDUCTION BAFFLE WITH WAFER CATCHER FOR CHEMICAL-VAPOR-DEPOSITION APPARATUS

[75] Inventors: Paul L. Deaton, Sunnyvale; Norma Riley, Pleasanton, both of Calif.; James V. Rinnovatore, Nazareth, Pa.

[73] Assignee: Applied Materials, Inc., Santa Clara, Calif.

[21] Appl. No.: 782,147

[22] Filed: Oct. 24, 1991

Related U.S. Application Data

[63] Continuation-in-part of Ser. No. 545,425, Jun. 28, 1990, Pat. No. 5,188,672.

[51] Int. Cl.$^5$ .................................... C23C 16/00
[52] U.S. Cl. .................................... 118/715; 118/725; 427/248.1
[58] Field of Search .................. 118/715, 725; 427/248.1

[56] References Cited

U.S. PATENT DOCUMENTS

| 4,282,267 | 8/1981 | Kuyel | 427/451 |
|---|---|---|---|
| 4,583,492 | 4/1986 | Cowher et al. | 118/723 |
| 4,834,022 | 5/1989 | Mahawili | 118/715 |
| 4,838,201 | 6/1989 | Fraas | 118/715 |
| 4,992,044 | 2/1991 | Philipossian | 118/715 |
| 5,038,711 | 8/1991 | Dan | 118/728 |
| 5,188,672 | 2/1993 | Rinnovatore | 118/715 |

FOREIGN PATENT DOCUMENTS

| 0270991 | 2/1987 | European Pat. Off. . | |
| 2743909 | 9/1977 | Fed. Rep. of Germany . | |
| 59-43861 | 3/1984 | Japan | 118/715 |
| 59-52834 | 3/1984 | Japan | 118/728 |
| 61-111994 | 11/1985 | Japan . | |
| 61-2319 | 1/1986 | Japan | 118/724 |
| 63-089492 | 4/1988 | Japan . | |

Primary Examiner—Richard Bueker
Attorney, Agent, or Firm—Raymond R. Moser, Jr.

[57] ABSTRACT

In an epitaxial reactor system using a vacuum pump which is connected to the reaction chamber by an exhaust line, particulate contaminants normally deposit in the exhaust line near its juncture with the reaction chamber. When the vacuum pump is isolated from the reaction chamber during a back-filling operation, these contaminants can be entrained in the currents of gas normally produced in the back-filling operation. A removable baffle device having the shape of a truncated cone and including a wafer catching device that holds a disk shaped particulate baffle member is placed in the exhaust line at its juncture with the reaction chamber to prevent these particles from re-entering the reaction chamber.

19 Claims, 4 Drawing Sheets

PARTICULATE REDUCTION BAFFLE WITH WAFER CATCHER FOR CHEMICAL-VAPOR-DEPOSITION APPARATUS

CROSS REFERENCE TO RELATED APPLICATION

This application is a continuation-in-part application of a prior, co-pending U.S. patent application entitled "Reduction of Particulate Contaminants in Chemical-Vapor-Deposition Apparatus", Ser. No. 07/545,425, filed on Jun. 28, 1990, now U.S. Pat. No. 5,188,672 naming James V. Rinnovatore as inventor and assigned to Applied Materials, Inc., the common assignee.

BACKGROUND OF THE INVENTION

1. Field of the Invention

The present invention relates generally to the field of semiconductor wafer fabrication equipment useful in the manufacture of semiconductor devices, more particularly to devices for reducing particulate contamination and catching fallen wafers in chemical vapor deposition (CVD) equipment.

2. Description of the Prior Art

Devices of the above type are used in the fabrication of semiconductor devices on 100 millimeter or larger wafers of silicon. Epitaxial layers are formed on the surfaces of the wafers by heating them to temperatures in the region of 800 to 1200 degrees Celsius in a bell jar containing a gaseous atmosphere consisting of a hydrogen carrier gas mixed with one or more reactive gases such as a silicon source gas and a dopant source gas.

During the various processing steps which are used to produce layers of different types on the surfaces of the wafers, great care must be taken to avoid the deposition of particulate contaminants on the surfaces of the wafers. The demand for ever larger scale of circuit integration and the consequent need for greater chip density have made the elimination of particulate contaminants an increasingly difficult problem. As the size of the circuit features has become smaller, the minimum size of particulate contaminants which can degrade circuit performance has also become smaller. This is true because particles as small as 1/10 the size of the circuit features can seriously degrade the electrical properties of the circuit.

One source of such contaminants is the exhaust line used to conduct gases from the interior of the bell jar when they are no longer needed. Such an exhaust line may terminate in a sump at atmospheric pressure or may connect the processing system to a source of high vacuum such as a vacuum pump. During normal processing this line is open to the vacuum pump, such that there is a steady flow of gases, including entrained particulate contaminants, in a direction away from the reaction chamber.

However, when a processing step has been completed, a valve in the exhaust line is closed while the reaction chamber is back-filled with a new processing atmosphere through an inlet line. During this back-filling operation, strong currents of moving gases in the reaction chamber can sweep up and entrain particulate contaminants from the region of the exhaust line near its junction with the reaction chamber.

The presence of contaminant particles in the short section of exhaust line between the valve and the reaction chamber is difficult to avoid, since some particulate matter is inevitably present in the effluent from the reaction chamber. However, the particle performance of the system could be improved if such particulate contaminants could be prevented, or at least inhibited, from returning to the reaction chamber during the back-filling operation.

A further problem encountered in wafer fabrication utilizing a bell jar apparatus is that an individual wafer may fall from the susceptor and cover the vacuum exhaust port, resulting in the cessation of processing in the bell jar. This problem has been previously solved utilizing a prior art wafer catching device that is positioned in the exhaust port. Such a prior art device is described and depicted hereinbelow. A need therefore exists for a single device which is disposed within the exhaust port of the bell jar to both act as a wafer catching device and as a particulate reduction device.

SUMMARY OF THE INVENTION

The improved baffle for inhibiting the return of particulate matter from the exhaust line into the reaction chamber of a epitaxial reactor system extends transversely across the mouth of the exhaust line and has a central aperture of a smaller cross-sectional area than the exhaust line. The baffle has a concave surface facing the reaction chamber, and a convex surface facing the interior of the exhaust line. A horizontally disposed baffle disk is engaged in a spaced apart manner relative to the central aperture to inhibit particulates from reentering the chamber through the aperture. The baffle assembly is formed with a wafer catching bar that protrudes into the chamber to prevent fallen wafers from blocking the exhaust port.

During normal operation of the epitaxial reactor system, the vacuum system is in operation to remove normal waste byproducts and particulate contaminants from the system. In this mode of operation, the central aperture in the baffle is sufficiently large in cross section to cause only a minimal flow restriction.

At the completion of a processing step, when the vacuum pump is isolated from the reaction chamber by the closure of a valve in the exhaust line, the reaction chamber is back-filled with a new processing atmosphere via an inlet line. The strong convection currents of gas in the reaction chamber are prevented from generating eddy currents in the portion of the exhaust line near its junction with the wall of the reaction chamber by the presence of the baffle. Particulates which might reenter the chamber through the central aperture of the baffle are further inhibited by the centrally disposed baffle disk which covers the central aperture in a spaced apart relationship. At all times, the wafer catching bar acts to prevent any fallen wafer from blocking the exhaust port.

It is an advantage of the present invention that it provides an epitaxial reactor system having improved particle performance compared to the prior art.

It is another advantage of the present invention that it provides an epitaxial reactor system having a reaction chamber with an exhaust line connected to either an exhaust sump or a vacuum pump, wherein particulate matter in the exhaust line is inhibited from re-entering the reaction chamber.

It is a further advantage of the present invention that it provides an epitaxial reactor system having an improved baffle located at the junction of the exhaust line and the reaction chamber to prevent particulate matter in the exhaust line from re-entering the reaction chamber.

It is yet another advantage of the present invention that it provides an improved particulate reduction baffle in a form which can be readily removed from the exhaust line when desired.

It is yet a further advantage of the present invention that it provides an improved particulate reduction baffle with a wafer catching apparatus which causes the minimum practical flow restriction to gases traveling along the exhaust line from the reaction chamber to the vacuum pump and prevents fallen wafer blockage of the exhaust port.

It is still another advantage of the present invention that it provides an improved particulate reduction baffle that is removable from the reaction chamber for cleaning, whereby it may be cleaned and replaced into the chamber, and whereby cleaning and maintenance of the reaction chamber is facilitated.

The above and other features, objects and advantages of the present invention together with the best mode known to the inventor thereof for carrying out his invention will become more apparent for reading the following description of the invention.

IN THE DRAWING

DETAILED DESCRIPTION OF THE PREFERRED EMBODIMENT

Figure 1:
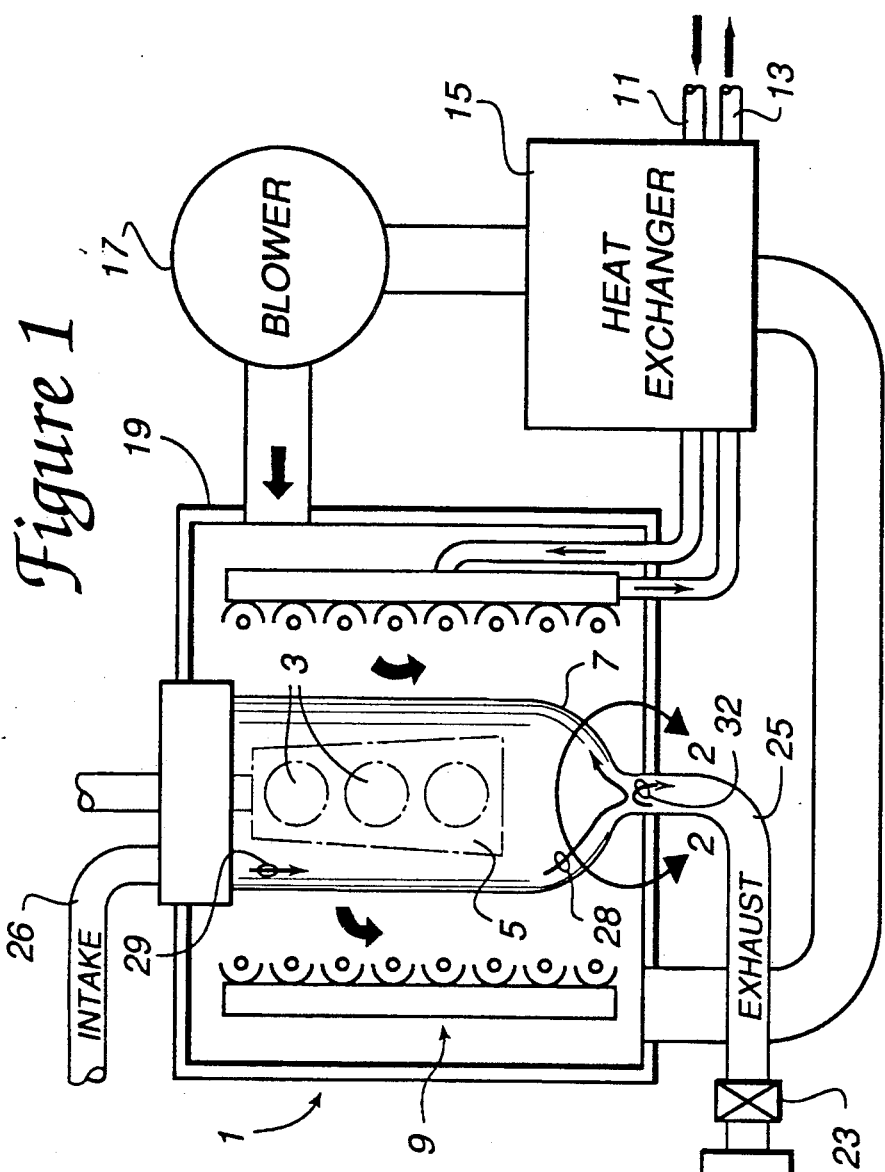
FIG. 1 is a cross-sectional view, in somewhat schematic form, of a CVD epitaxial reactor system incorporating a first embodiment of the present invention.

FIG. 1 illustrates a chemical-vapor-deposition system 1 in a form such as might be used for producing epitaxial layers on silicon wafers during the fabrication of semiconductor devices. System 1 is shown in a schematic and generalized manner to permit explanation of the context within which the present invention operates.

A plurality of substrates 3, which might be 150 millimeter silicon wafers, for example, are supported on a graphite susceptor 5 for processing in a gaseous environment confined within a quartz bell jar 7. Banks of radiant heaters 9 surround the bell jar for heating the susceptor and substrates to processing temperatures in the region of 800–1200 degrees Celsius.

Cooling water from an external source (not shown) flows into system 1 via a coolant inlet line 11 and returns from the system via a coolant outlet line 13. Within system 1, the cooling water extracts heat from the banks of radiant heaters 9 and from an air-to-water heat exchanger 15.

Heat exchanger 15 is part of a recirculating air cooling system which includes a blower 17 to drive a steady stream of cool air from exchanger 15 into a reactor enclosure 19, from which the heated air returns to heat exchanger 15. Within enclosure 19, a stream of cooling air envelops and flows downwardly over the surface of bell jar 7 to maintain its temperature low enough to prevent unwanted reactions between the inner surface of bell jar 7 and the reactive gaseous atmosphere within.

Typically, the processing of silicon-wafer substrates proceeds through a series of steps involving exposure to different gaseous atmospheres within bell jar 7. During these steps various waste products, including particulate contaminants, are continuously removed from the interior of bell jar 7 by a vacuum system which includes a vacuum pump 21 coupled to a valve 23 which is in turn coupled to bell jar 7 by an exhaust line 25.

Filling of bell jar 7 at the start of each processing cycle takes place through an intake line 26, from which the gaseous atmosphere flows downwardly as indicated by arrow 29. During this backfilling operation, valve 23 is closed, such that the section of exhaust line 25 between valve 23 and bell jar 7 is isolated from vacuum pump 21. As suggested by arrow 28, the backfilling gaseous atmosphere sweeps over the hemispherical bottom surface of bell jar 7, deviating slightly into the mouth of exhaust line 25 near its junction with jar 7.

Although the exact pattern of ga flow in this region is unknown, it is believed that eddy currents, as suggested by arrow 32, are probably induced in the portion of exhaust line 25 near the bottom of jar 7. These eddy currents are believed responsible for dislodging particulate matter which was deposited on the inside wall of exhaust line 25 during the preceding processing steps. Once dislodged, such particulate matter can be entrained in the flow of gas across the mouth of exhaust line 25.

Whatever the actual flow pattern, it is known that the back-filling operation results in the reversion of considerable particulate matter from the walls of exhaust line 25 into the interior of bell jar 7. Once in the bell jar 7, this particulate contamination is free to deposit on the wafers 3.

Figure 2:
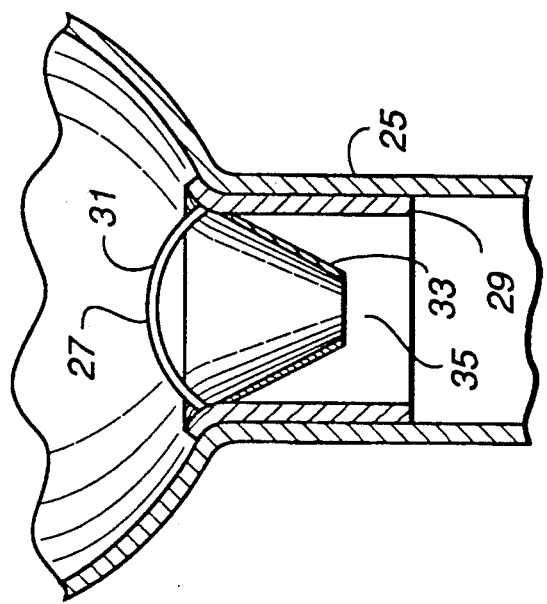
FIG. 2 is a detailed sectional view of the portion of FIG. 1 within the line 2—2 in FIG. 1.
Figure 3:
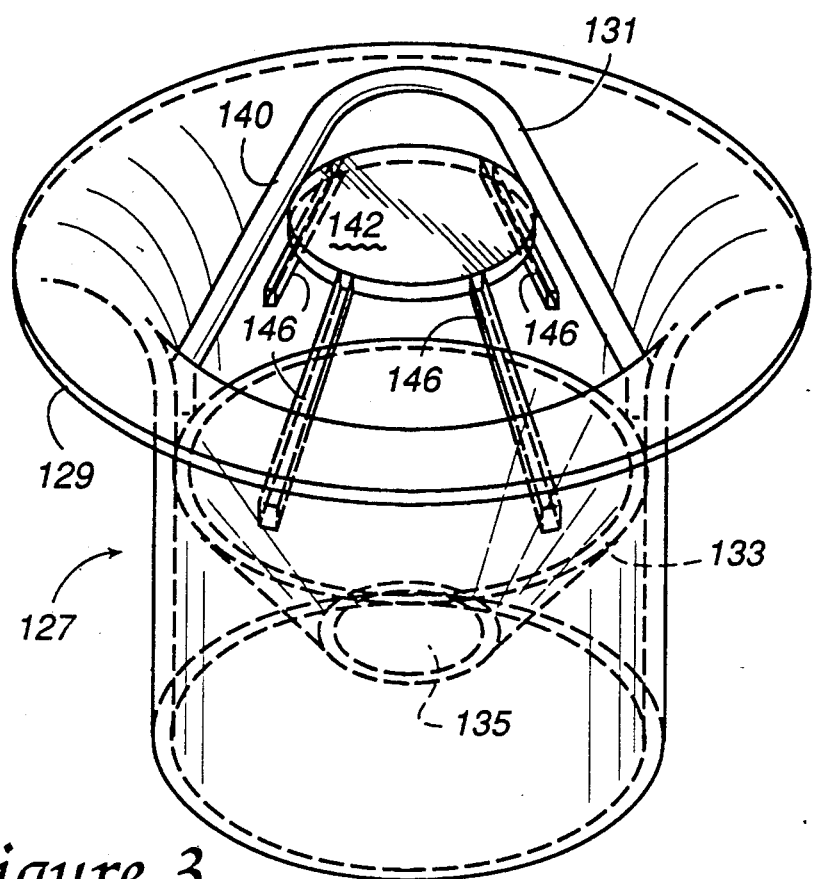
FIG. 3 is a perspective view of the improved particulate reduction baffle with wafer catcher of the present invention.
Figure 4:
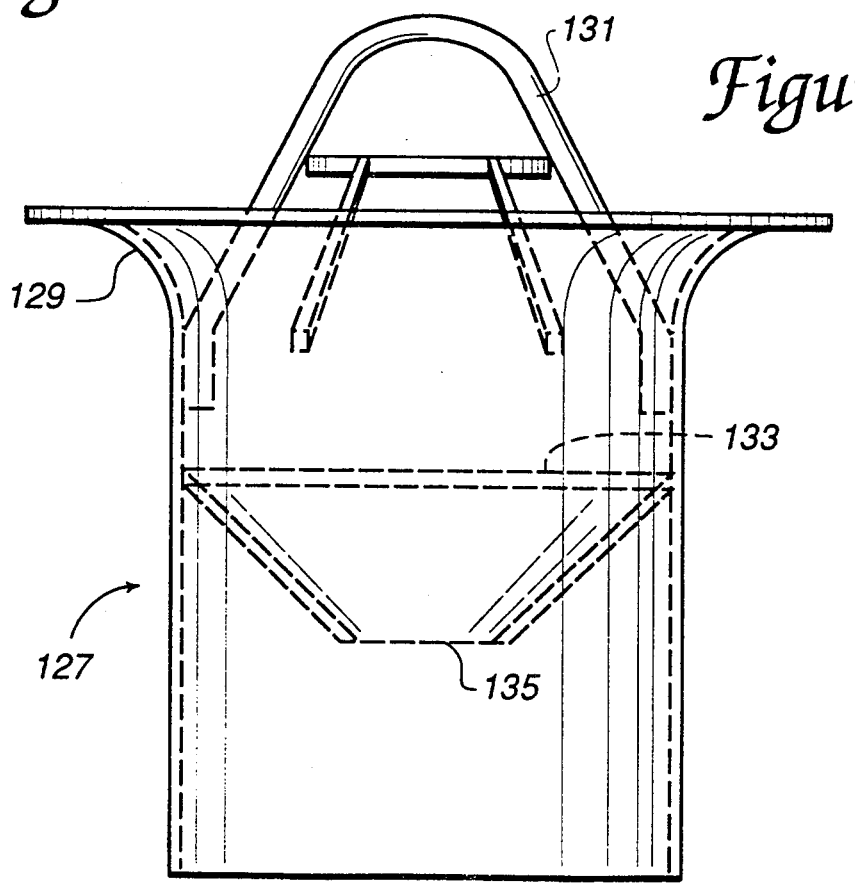
FIG. 4 is a side elevational view of the device depicted in FIG. 3.

Turning now to FIG. 2, the region of FIG. 1 near the junction of exhaust line 25 and bell jar 7 is shown in enlarged section. In particular, and in accordance with the present invention, a particle restrictor 27 has been illustrated positioned within and extending across the mouth of exhaust line 25.

Particle restrictor 27 includes a flanged sleeve 29 which is dimensioned to easily slip into the mouth of exhaust line 25 at its junction with bell jar 7. A curved handle 31, which may be of round cross section and approximately ¼ inch in diameter, permits easy insertion and removal of restrictor 27. A baffle 33 is joined around its upper rim to sleeve 29 and extends generally downwardly therefrom to terminate in a reduced-diameter aperture 35.

Baffle 33 has been illustrated in its preferred shape, which is that of a truncated conical section. However, baffle 33 might alternatively have any other shape which is concave as viewed from the side facing into bell jar 7. For example, baffle 33 might be a hemisphere or other portion of a sphere, or might have some other aspherical concave shape. However, a truncated conical shape is relatively easy to fabricate and has been found to provide a considerable reduction in the reversion of particulate contamination from exhaust line 25.

The exact nature of the gaseous flow which results in this reduction in particulate contamination has not been fully analyzed. However, it is believed that two mechanisms may be involved: (1) a decoupling of the gas within exhaust line 25 from the pattern of swirling gases which occurs in bell jar 7 during back-filling, reducing the generation of eddy currents in exhaust line 25; and (2) a tendency to trap a large percentage of any mobile particles in exhaust line 25, especially in the region between the lower surface of baffle 33 and the adjacent portions of sleeve 29.

The second of these two mechanisms suggests that the convex shape of baffle 33 as viewed from the side facing into exhaust line 25 also contributes to the performance in reducing particle contamination. Such a convex shape produces, between baffle 33 and the adjacent inner surface of sleeve 29, an annular region having a progressively converging shape which is well suited to trapping a majority of particles moving in a direction toward bell jar 7.

Particle restrictor 27 may be fabricated entirely of quartz, for example, such that its coefficient of thermal expansion matches that of bell jar 7 and exhaust line 25. Typical dimensions are: outer diameter of sleeve 29 = 4.0 inches; diameter of aperture 35 = 1.5 inches.

Figure 5:
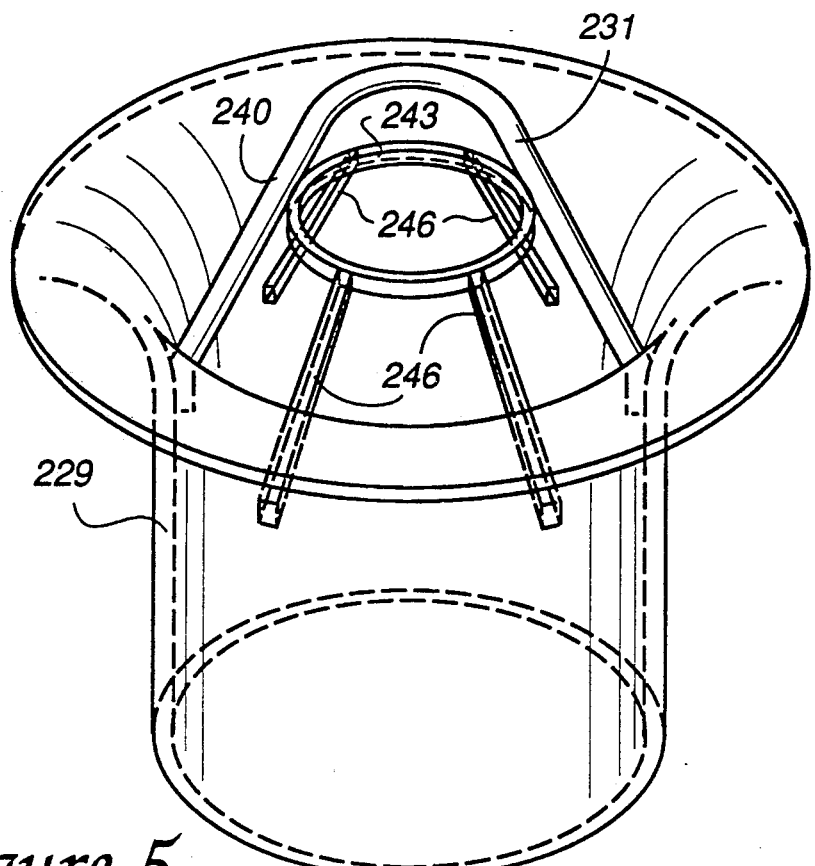
FIG. 5 is a perspective view of a prior art wafer catcher device.
Figure 6:
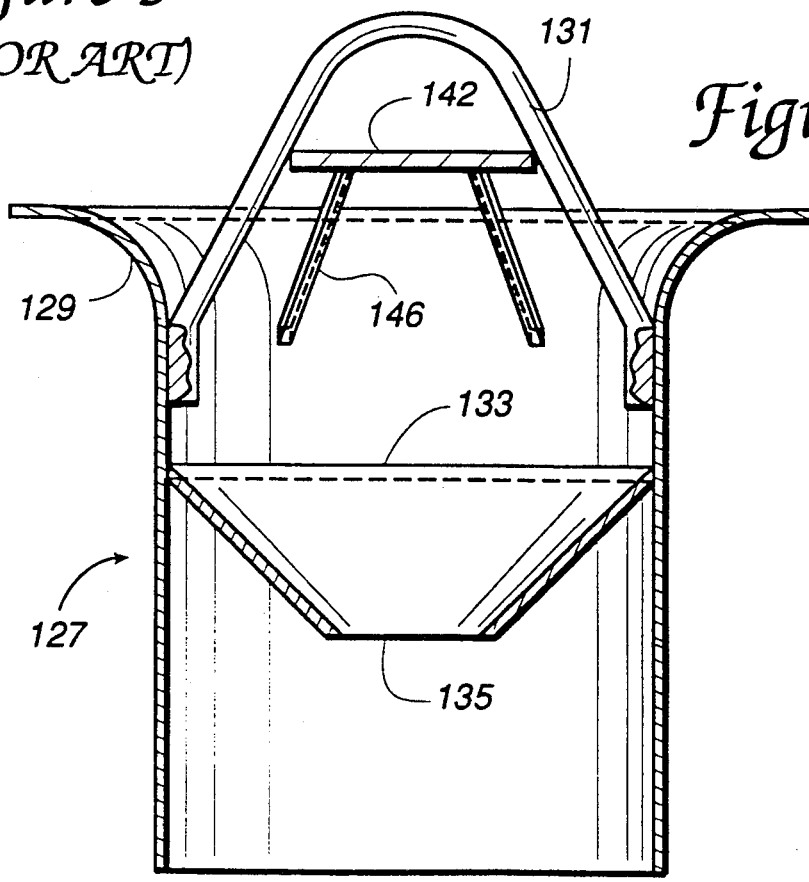
FIG. 6 is a cross-sectional view of the device depicted in FIG. 3, taken along lines 6—6 of FIG. 3.
Figure 7:
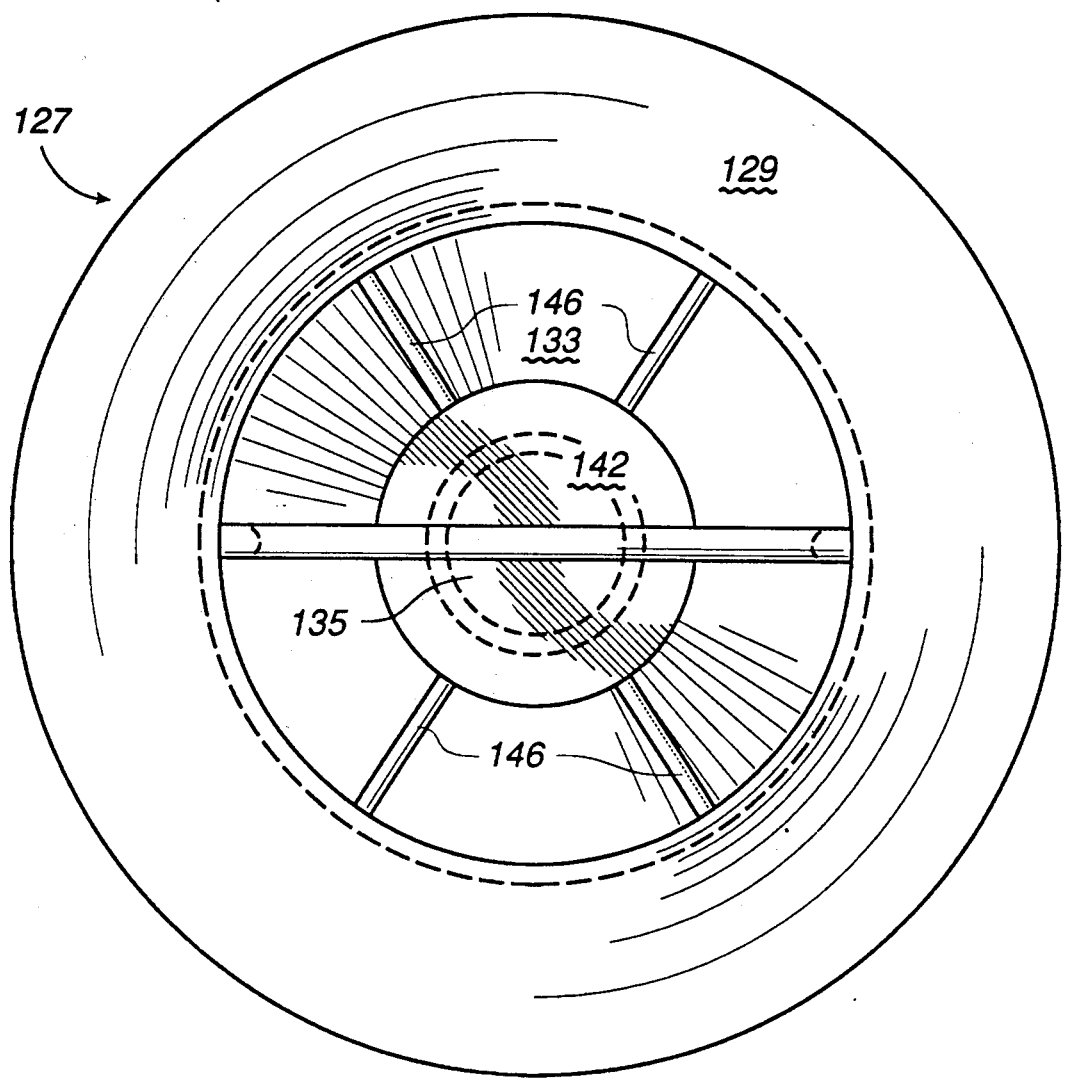
FIG. 7 is a top plan view of the device depicted in FIG. 3.

An improved particulate reduction baffle device 127, combined with a wafer catching device is depicted in FIGS. 3, 4, 6 and 7. A prior art wafer catching device is depicted in FIG. 5. The improved device 127 includes a flanged sleeve 129 which is similar in all respects to sleeve 29 depicted in FIG. 2 and described hereinabove A baffle 133, shown as a truncated conical section, is engaged at its outer rim to the inner surface of the sleeve 129, and a reduced diameter aperture 135 is disposed generally downwardly therefrom. It is therefore to be understood that the baffle 133 is substantially identical to baffle 33 depicted in FIG. 2 and described hereinabove.

A wafer catching device 140 is disposed in the upper portion of the sleeve 129, such that a wafer deflection member 131 (which also acts as a handle for the device) projects upwardly into the bell jar when the device 127 is inserted in the exhaust port of a bell jar, as is depicted in FIG. 2 with reference to device 27. The wafer catcher 140 also includes a circular, disk-shaped particulate baffle member 142 that is engaged in a spaced-apart relationship relative to baffle aperture 135 by four support legs 146. Each of the support legs 146 is engaged at its upper end to the edge of the disk 142 and at its lower end to the inner surface of the flange member 129. The outer edge of the disk 142 may also be engaged to the wafer deflection member 131 in the preferred embodiment.

A prior art wafer catching device 240 is depicted in FIG. 5. The prior art device includes a wafer deflection member 231 which is engaged to a sleeve member 229 proximate the upper end thereof, such that the member 231 extends into the bell jar when the flange 229 is inserted at the exhaust port. The prior art device includes a ring-shaped member 243 that is supported by four legs 246. It is therefore to be appreciated upon comparing FIG. 3 and FIG. 5 that a significant difference between the present invention and the prior art wafer catching device 240 is that the ring member 243 has been advantageously replaced by the disk baffle member 142.

As has been previously discussed with regard to baffle member 33, the baffle member 133 serves to prevent particulates from traveling back into the bell jar from the exhaust line 25. The improved device 127 provides the baffle disk 142 to further inhibit the reentry of particulates into the bell jar upwardly through the aperture 135. To accomplish this, the disk 142 is preferably formed with a greater diameter than the aperture 135, and is positioned in a spaced-apart relationship relative to aperture 135, such that the exhaust flow through the exhaust port is not impeded by the proximity of the disk 142 to the aperture 135. However, the disk 142 is positioned close enough to the aperture 135 to provide a baffling effect that inhibits particulates in upwardly flowing air currents from reentering the bell jar. In the preferred embodiment, all components of the device 127 are formed from quartz, as with device 27. The diameter of the aperture 135 is approximately 1.4 inches and the diameter of the disk 142 is approximately 1.5 inches. The baffle disk 142 is positioned approximately 4.5 inches above the aperture 135.

In addition to reducing the reentry of particulates into the bell jar, the present invention also facilitates the cleaning and maintenance of the bell jar. That is, because the present invention extends down into the exhaust flange area of the reaction chamber, it serves to keep this area of the reaction chamber clean and free of particulates. Also, the baffle member may be removed from the reaction chamber for cleaning without the necessity for cleaning the exhaust flange area of the bell jar.

Although this invention has been described with some particularity with respect to preferred embodiments thereof which represent the best mode known to the inventor for carrying out his invention, many changes could be made and many alternative embodiments could thus be derived without departing from the scope of the invention. In particular, although the invention has been described as being part of a chemical-vapor-deposition system 1 which is to be used primarily for epitaxial deposition on silicon wafers and which relies on a vacuum pump to exhaust spent processing atmospheres from the reaction chamber, the invention is not so limited. The invention can easily be incorporated in any other type of CVD system, including those which exhaust into a sump at atmospheric pressure. Consequently, the scope of the invention is to be determined only from the following claims.

What is claimed is:

1. In a chemical-vapor-deposition (CVD) apparatus of the type employing a reaction chamber for confining a reactive gaseous atmosphere in contact with a substrate, apparatus comprising:

a reaction chamber having a gas outlet for exhausting a gaseous atmosphere from said reaction chamber and having a gas inlet for connection to a source of a reactive gaseous atmosphere for filling said chamber;

said gas outlet comprising an outlet conduit of a first cross-sectional area, said outlet conduit being joined to a wall portion of said reaction chamber in gas flow communication with the interior of said reaction chamber at a point of junction between said wall portion and said outlet conduit; and particle restrictor means located at said junction for restricting reverse flow of particulate contaminants from said outlet conduit into said reaction chamber; said particle restrictor means comprising a disk member positioned at said junction and extending transversely across said outlet conduit thereat, and means for supporting said disk member such that said disk member is centrally disposed relative to said first cross-sectional area and positioned within said chamber at a distance from said junction.

2. The apparatus of claim 1 further comprising a wafer catching means disposed proximate said particle restrictor means for preventing fallen wafers from blocking said gas outlet.

3. The CVD apparatus of claim 1 wherein said disk member has a diameter that is less than a diameter of said first cross-sectional area of said outlet conduit.

4. The apparatus of claim 1 wherein said particle restrictor means further comprises a baffle positioned at said junction and extending transversely across said outlet conduit thereat; said baffle having a convex shape on the face thereof facing said outlet conduit and including an aperture formed therethrough, said aperture having a second cross-sectional area less than said first cross-sectional area of said outlet conduit.

5. The apparatus of claim 4 wherein said convex face of said baffle is conical in shape.

6. The apparatus of claim 5 wherein said baffle comprises a truncated cone having a central axis that is generally parallel to a central axis of said outlet conduit.

7. The apparatus of claim 6 wherein said baffle comprises a thin-walled cone truncated by a pair of imaginary spaced-apart parallel planes, each said imaginary plane being disposed generally normal to the axis of said cone to form said aperture of said second cross-sectional area at the intersection of one of said planes and said cone, and to form at the intersection of the other of said planes and said cone an open of a larger cross-sectional area than said aperture.

8. The apparatus of claim 4 wherein said baffle is formed of quartz.

9. The apparatus of claim 4 further including a flanged mounting sleeve having a portion thereof dimensioned to be received within and supported in close fitting relationship within said outlet conduit, and wherein said baffle is joined to, and extends across the interior of, said mounting sleeve, whereby said sleeve and baffle are insertable within and removable from said outlet conduit.

10. The apparatus of claim 9 further including a handle joined to the end of said mounting sleeve facing into said reaction chamber when said sleeve is received within said outlet conduit, whereby said sleeve and baffle can be gripped by said handle and withdrawn from said outlet conduit when desired.

11. The apparatus of claim 10 wherein portions of said handle projects into said reaction chamber to form a wafer catching means, said wafer catching means functioning to prevent a dislodged wafer from covering said gas outlet.

12. A chemical-vapor-deposition (CVD) apparatus comprising:

a reaction chamber having a gas outlet for exhausting a gaseous atmosphere from said reaction chamber and having a gas inlet for connection to a source of a reactive gaseous atmosphere for filling said chamber;

said gas outlet including an outlet conduit of a first cross-sectional area, said outlet conduit being joined at a junction point to a wall portion of said reaction chamber in gas flow communication with the interior of said reaction chamber;

a particle restrictor, said particle restrictor being located at said junction point for restricting a reverse flow of particulate contaminants from said outlet conduit into said reaction chamber; said particle restrictor including a baffle positioned at said junction point and extending transversely across said outlet conduit, said baffle having an aperture formed therethrough, said aperture having a second cross-sectional area that is less than said first cross-sectional area of said outlet conduit; said particle restrictor further including a disk member and means for supporting said disk member, said disk member being supported in a position that is centrally disposed relative to said first cross-sectional area of said outlet conduit, and being disposed in a spaced apart relationship relative to said aperture such that said disk member is positioned within said chamber at a distance from said junction point.

13. The CVD apparatus of claim 12 wherein a diameter of said disk member is greater than a diameter of said second cross-sectional area of said aperture.

14. The CVD apparatus of claim 12 wherein a center of said disk member is co-linear with a central axis of said outlet conduit.

15. The CVD apparatus of claim 12 wherein a diameter of said disk member is less than a diameter of said first cross-sectional area of said outlet conduit.

16. The CVD apparatus of claim 12 wherein said disk member supporting means supports said disk member in a position proximate to said aperture for restricting the flow of particles through said aperture.

17. The CVD apparatus of claim 16 wherein said baffle comprises a truncated cone having a central axis that is substantially parallel to a central axis of said outlet conduit.

18. The CVD apparatus of claim 16 further including a flanged mounting sleeve having a portion thereof dimensioned to be received within and supported in close fitting relationship within said outlet conduit, wherein said baffle is joined to said mounting sleeve and extends across an interior portion of said mounting sleeve, and wherein said support structure is engaged to said mounting sleeve.

19. The CVD apparatus of claim 16 wherein a portion of said support structure is formed as a wafer catcher that is disposed proximate said gas outlet for preventing fallen wafers from blocking said gas outlet.

* * * * *